US011933684B2

(12) United States Patent
Kato et al.

(10) Patent No.: US 11,933,684 B2
(45) Date of Patent: Mar. 19, 2024

(54) TACTILE AND PROXIMITY SENSOR, AND SENSOR ARRAY

(71) Applicant: Murata Manufacturing Co., Ltd., Nagaokakyo (JP)

(72) Inventors: Takatoshi Kato, Nagaokakyo (JP); Hiroshi Watanabe, Nagaokakyo (JP); Kohei Sugahara, Nagaokakyo (JP); Hironari Yamamoto, Nagaokakyo (JP); Hiraku Kawai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 708 days.

(21) Appl. No.: 16/952,158

(22) Filed: Nov. 19, 2020

(65) Prior Publication Data

US 2021/0072101 A1 Mar. 11, 2021

Related U.S. Application Data

(63) Continuation of application No. PCT/JP2019/022490, filed on Jun. 6, 2019.

(30) Foreign Application Priority Data

Jul. 18, 2018 (JP) .................................. 2018-135141

(51) Int. Cl.
*G01L 1/24* (2006.01)
*G01S 7/481* (2006.01)
*G01S 17/04* (2020.01)

(52) U.S. Cl.
CPC .............. *G01L 1/24* (2013.01); *G01S 7/4813* (2013.01); *G01S 17/04* (2020.01)

(58) Field of Classification Search
CPC ......... G01L 1/24; G01S 7/4813; G01S 17/04; G06F 3/04166; G06F 2203/04101; G06F 3/0421; G06F 3/04144; H03K 17/78
See application file for complete search history.

(56) References Cited

U.S. PATENT DOCUMENTS

2010/0253650 A1 10/2010 Dietzel et al.
2011/0032214 A1* 2/2011 Gruhlke ............... G06F 3/0421
359/291

(Continued)

FOREIGN PATENT DOCUMENTS

EP 3 193 192 A1 7/2017
JP 60-62496 A 4/1985

(Continued)

OTHER PUBLICATIONS

Official Communication issued in International Patent Application No. PCT/JP2019/022490, dated Aug. 27, 2019.

(Continued)

*Primary Examiner* — Francis C Gray
(74) *Attorney, Agent, or Firm* — Keating & Bennett, LLP

(57) ABSTRACT

A tactile and proximity sensor includes a light source, a light receiving section, and a cover. The light source emits light. The light receiving section receives light and generates a signal providing a result of the received light. The cover includes an elastic body that deforms under external force and that covers the light source and the light receiving section. The cover includes a reflective section that reflects light between the light source and the light receiving section and a transmission section that allows light to pass through in a first direction from the light source and that allows light to pass through in a second direction from the light receiving section.

18 Claims, 13 Drawing Sheets

(56) References Cited

U.S. PATENT DOCUMENTS

| | | | |
|---|---|---|---|
| 2011/0067504 A1 | 3/2011 | Koyama et al. | |
| 2011/0157097 A1* | 6/2011 | Hamada | G06F 3/0421 |
| | | | 345/175 |
| 2015/0323670 A1 | 11/2015 | Shirasaka | |
| 2016/0141440 A1 | 5/2016 | Chun et al. | |
| 2016/0146938 A1* | 5/2016 | Becker | G01S 7/4816 |
| | | | 250/208.2 |
| 2018/0181260 A1* | 6/2018 | Kikuchi | G06F 3/0425 |

FOREIGN PATENT DOCUMENTS

| | | | | |
|---|---|---|---|---|
| JP | 2010-539474 A | 12/2010 | | |
| JP | 5089774 B2 | 12/2012 | | |
| JP | 2014-045685 A | 3/2014 | | |
| JP | 5825604 B2 | 12/2015 | | |
| WO | WO-2020166185 A1 * | 8/2020 | | G01B 11/026 |

OTHER PUBLICATIONS

Ukas Buergi et al., "Optical proximity and touch sensors based on monolithically integrated polymer photodiodes and polymer LEDs", Science Direct, Organic Electronics, Dec. 28, 2005, pp. 114-120.
Official Communication issued in corresponding Chinese Patent Application No. 201980030903.5, dated Aug. 13, 2021.

* cited by examiner

TACTILE AND PROXIMITY SENSOR, AND SENSOR ARRAY

CROSS REFERENCE TO RELATED APPLICATIONS

This application claims the benefit of priority to Japanese Patent Application No. 2018-135141 filed on Jul. 18, 2018 and is a Continuation Application of PCT Application No. PCT/JP2019/022490 filed on Jun. 6, 2019. The entire contents of each application are hereby incorporated herein by reference.

BACKGROUND OF THE INVENTION

1. Field of the Invention

The present invention relates to a tactile and proximity sensor, and a sensor array.

2. Description of the Related Art

In recent years, various sensors that are installed in robot hands and the like and that enable a variety of sensing including a tactile sense have been proposed (for example, Japanese Patent No. 5089774, Japanese Patent No. 5825604 and International Publication No. 2014/045685).

Japanese Patent No. 5089774 describes a composite sensor to be attached to a fingertip surface of a robot hand that, for example, holds a physical object. The composite sensor of Japanese Patent No. 5089774 includes a tactile sensor with a pressure-sensitive sheet and a proximity sensor made up of a reflective photo sensor. The composite sensor of Japanese Patent No. 5089774 includes a combination of two sensors such that a detection surface of the proximity sensor is defined by the pressure-sensitive sheet.

Japanese Patent No. 5825604 describes an optical tactile sensor that enables measurement of six-axis forces. International Publication No. 2014/045685 describes a force sensor that detects a shearing force by using a variable frame. In Japanese Patent No. 5825604 and International Publication No. 2014/045685, tactile sensing for sensing various contact forces with physical objects is performed by an optical mechanism that uses deformation of an elastic body.

In the existing techniques, there is such a problem that, when proximity sensing is performed together with tactile sensing, an apparatus configuration is large as a result of separately installed sensors or a complicated mechanism of sensors due to the need of complicated detection principles.

SUMMARY OF THE INVENTION

Preferred embodiments of the present invention provide tactile and proximity sensors and sensor arrays that are each able to sense both contact force and proximity of a physical object with a simple mechanism.

A tactile and proximity sensor according to a preferred embodiment of the present invention senses contact force and proximity of a physical object in accordance with a result of received light. The tactile and proximity sensor includes a light source, a light receiving section, and a cover. The light source emits light. The light receiving section receives light and generates a signal providing a result of the received light. The cover includes an elastic body that deforms under external force and covers the light source and the light receiving section. The cover includes a reflective section that reflects light between the light source and the light receiving section, and a transmission section that allows light to pass through in a first direction from the light source and that allows light to pass through in a second direction from the light receiving section.

A sensor array according to a preferred embodiment of the present invention includes a plurality of optical sensors.

With the tactile and proximity sensors and the sensor arrays according to preferred embodiments of the present invention, both contact force and proximity of a physical object are able to be sensed with a simple mechanism that a cover including a reflective section is provided with a transmission section.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of tactile and proximity sensors and sensor array according to the present invention will be described with reference to the accompanying drawings.

The preferred embodiments are illustrative, and partial replacements or combinations of components described in different preferred embodiments are possible. The description of matters the same as or similar to those of the first preferred embodiment is omitted in the second and following preferred embodiments, and only differences will be described. Particularly, similar operation and advantageous effects with a similar structure and features will not be described one by one for each preferred embodiment.

First Preferred Embodiment

In a first preferred embodiment of the present invention, an optical sensor that provides tactile and proximity sensing with a simple optical mechanism will be described as an example of the tactile and proximity sensor.

1. Configuration

Figure 1A:
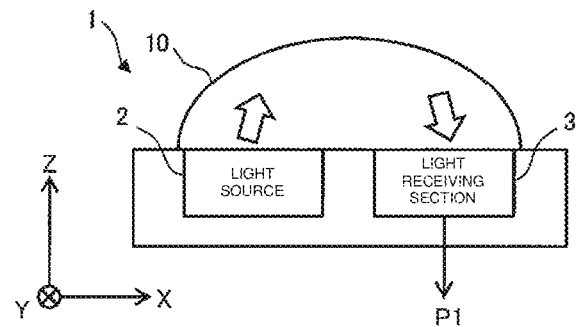
FIGS. 1A to 1C are diagrams showing the outline of an optical sensor according to a first preferred embodiment of the present invention.
Figure 1B:
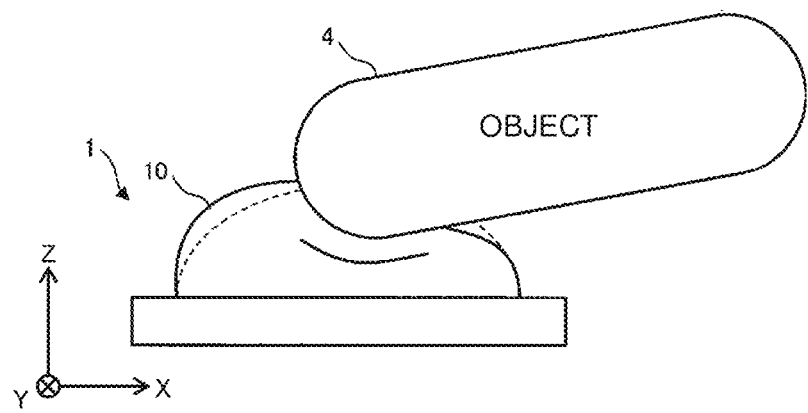
Figure 1C:
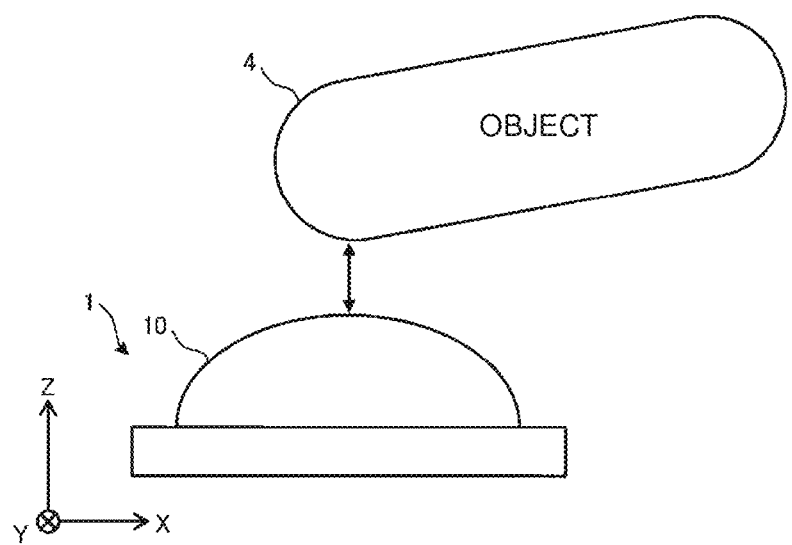

The optical sensor according to the first preferred embodiment will be described with reference to FIGS. 1A to 1C and FIG. 2. FIGS. 1A to 1C are diagrams showing the outline of the optical sensor 1 according to the first preferred embodiment.

FIG. 1A shows the outline of the optical sensor 1 according to the first preferred embodiment. FIG. 1B shows an example of tactile sensing with the optical sensor 1. FIG. 1C shows an example of proximity sensing with the optical sensor 1.

As shown in FIG. 1A, the optical sensor 1 according to the first preferred embodiment includes a light source 2, a light receiving section 3, and a dome 10. The dome 10 is an example of a cover to cover the light source 2 and the light receiving section 3. Hereinafter, in the optical sensor 1, a direction in which the dome 10 protrudes is defined as Z direction, and two directions perpendicular or substantially perpendicular to the Z direction and perpendicular or substantially perpendicular to each other are defined as X direction and Y direction.

The optical sensor 1 of the first preferred embodiment is an example of an optical tactile and proximity sensor that causes the light source 2 to emit light inside the dome 10 and that outputs a received light signal P1 from the light receiving section 3. The dome 10 includes an elastic body that deforms under external force, for example, external stress. The optical sensor 1 is applicable to, for example, a robot hand to sense various physical objects to be held as objects.

FIG. 1B shows a state where an object 4 is in contact with the optical sensor 1. In the example of FIG. 1B, the dome 10 of the optical sensor 1 is deformed in accordance with a contact force exerted by the contact of the object 4. The optical sensor 1 outputs a result of received light that varies with a deformation, as a received light signal P1, thus performing tactile sensing to sense various contact forces.

FIG. 1C shows a state where the object 4 is in proximity to the optical sensor 1. The optical sensor 1 of the first preferred embodiment includes the dome 10 that limitedly allows light to pass through to provide not only the above-described tactile sensing but also proximity sensing to sense a state where the object 4 is spaced apart adjacent to or in a vicinity of the dome 10 by using a received light signal P1. Hereinafter, the features of the optical sensor 1 of the first preferred embodiment will be described.

In the optical sensor 1, the light source 2 includes one or a plurality of light emitting elements, for example, VCSEL (vertical cavity surface emitting laser). The light source 2 emits light in, for example, an infrared region or the like with narrow directivity. The light source 2 is not limited to VCSEL and may include various solid light emitting elements, for example, LEDs and LDs. A collimate lens that collimates light from the light source 2, or the like, may be included with the optical sensor 1.

The light receiving section 3 includes one or a plurality of light receiving elements, for example, PDs (photodiodes). The light receiving section 3 receives light and generates a received light signal P1 providing a result of the received light. The light receiving section 3 is not limited to PDs and may include various light receiving elements, for example, PSDs (position sensitive detectors) and CISs (CMOS image sensors).

Figure 2:
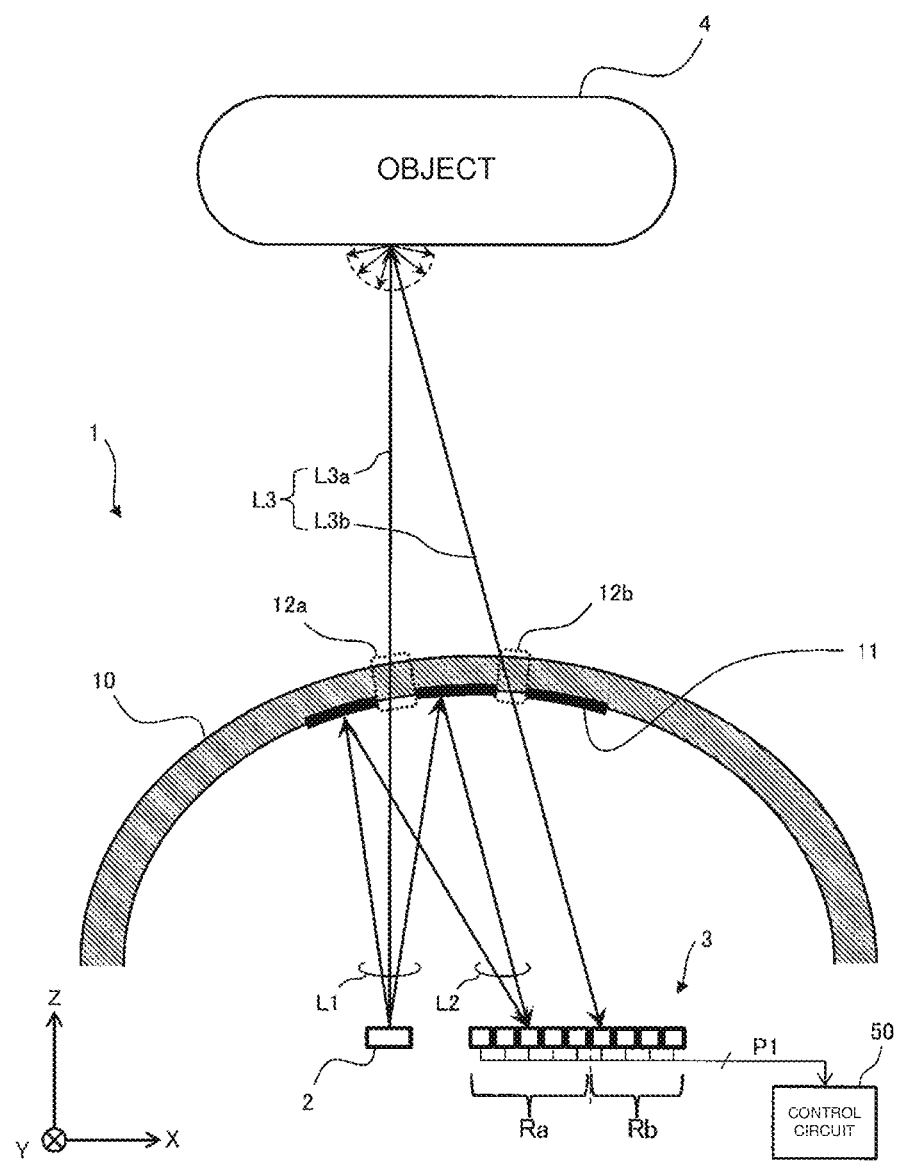
FIG. 2 is a diagram showing an example of the optical sensor according to the first preferred embodiment of the present invention.

FIG. 2 is a diagram showing an example of the optical sensor 1 according to the first preferred embodiment. In the example of FIG. 2, the light receiving section 3 includes a linear array of light receiving elements and includes a first light receiving region Ra and a second light receiving region Rb that lies in a region different from the light receiving region Ra. The light receiving section 3 is not limited to a linear array and may include a two-dimensional array of light receiving elements.

In the optical sensor 1 of the first preferred embodiment, as shown in FIG. 2, the dome 10 includes a mirror 11 and optical windows 12a, 12b (collectively referred to as optical windows 12). The dome 10 has, for example, a hollow spheroidal or substantially spheroidal shape. The dome 10 may include, for example, various rubber materials, resin materials, or the like. The size of the dome 10 is, for example, about 0.5 mm to about 50 mm and is preferably, for example, about 5 mm.

The mirror 11 is provided on, for example, the inner surface of the dome 10. The mirror 11 is an example of a reflective section that reflects light emitted from the light source 2 toward the light receiving section 3 in the dome 10. The mirror 11 has a reflectance more than or about equal to twice as high as the reflectance of, for example, a non-reflective section for the wave length band of light that is emitted from the light source 2. The non-reflective section is, for example, a portion where the mirror 11 is not provided in the dome 10. The mirror 11 is not limited to the inner surface of the dome 10. The mirror 11 may be, for example, provided on the outer surface or may be, for example, embedded between the inner surface and the outer surface.

The optical windows 12, for example, define openings in the mirror 11 in the dome 10. Accordingly, the transparency of the optical windows 12 is defined by the material of the dome 10. The optical windows 12 are examples of a transmission section of the dome 10 in the first preferred embodiment. The optical windows 12 have a transparency higher than or about equal to ten times as high as the transparency of, for example, a non-transmission section. The non-transmission section is, for example, the mirror 11. According to the position and size of the optical windows 12, when light having passed through the optical window 12a from the light source 2 strikes the object 4 and then scatters, a portion of the scattered light passes through the optical window 12b and strikes a portion of the second light receiving region Rb.

The optical windows 12 may be manufactured, for example, by providing physical holes in the dome 10 or may be manufactured by filling the holes with another material. The transmission section in the optical sensor 1 may include, for example, a half mirror, a polarizing plate, an optical filter, an optical grating, or the like.

In the example of FIG. 2, the light source 2 is, for example, located adjacent to or in a vicinity of a negative X-side focal point out of two focal points provided by the spheroidal or substantially spheroidal shape of the dome 10.

The position of the light receiving section 3 includes an area adjacent to or in a vicinity of a positive X-side focal point of the dome 10 in the first light receiving region Ra. Thus, light emitted from the light source 2 and reflected by the mirror 11 is able to be easily received by the first light receiving region Ra.

In the optical sensor 1 of the first preferred embodiment, the first optical window 12a to allow a portion of light from the light source 2 to pass therethrough and the second optical window 12b to limitedly guide light from an outside to the light receiving section 3 are provided. The first optical window 12a is located opposite the light source 2 to define a first transmission region on the inner surface of the dome 10. The second optical window 12b is located opposite the second light receiving region Rb of the light receiving section 3 to define a second transmission region.

In addition to the above-described structure and features, the optical sensor 1 may further include a control circuit 50 (FIG. 2) that detects the contact force and proximity of a physical object by analyzing a received light signal P1 from the light receiving section 3. The optical sensor 1 may be provided as a module different from the control circuit 50 or the like.

2. Operation

The operation of the optical sensor 1 will be described below. FIG. 2 shows the optical paths of various rays of light L1 to L3 from the optical sensor 1 when the object 4 is in proximity to the optical sensor 1.

As shown in FIG. 2, in the optical sensor 1, the light source 2 emits light L1 inside the dome 10. At the mirror 11 of the dome 10, reflected light L2 of the light L1 from the light source 2 arises. The light receiving section 3 receives the reflected light L2 from the mirror 11 in the first light receiving region Ra. For example, when the object 4 is not in contact with the optical sensor 1, a received light signal P1 (FIG. 1A) providing a predetermined result of received light corresponding to a state where the dome 10 is not deformed is generated in the first light receiving region Ra.

In the optical sensor 1 of the first preferred embodiment, a portion of light L1 from the light source 2 enters the first optical window 12 to become transmitted light L3 that transmits through the dome 10. In the example of FIG. 2, transmitted light L3a through the first optical window 12a travels in a positive Z direction from the light source 2 and exits to the outside of the optical sensor 1. When the object 4 is located adjacent to or in a vicinity of the positive Z side of the optical sensor 1, the transmitted light L3a through the first optical window 12a reaches the object 4 and is, for example, diffusely reflected.

At this time, when reflected light from the object 4 enters the second optical window 12b of the optical sensor 1, the reflected light is received by the second light receiving region Rb of the light receiving section 3 as transmitted light L3b through the second optical window 12b. The transmitted light L3b through the second optical window 12b has a specific direction of travel for the positional relation between the object 4 and the optical sensor 1. The light receiving section 3 generates a received light signal P1 providing a result of the received transmitted light L3b through the second optical window 12b for the second light receiving region Rb.

With the above-described optical sensor 1, a light receiving position where the transmitted light L3b (from the object 4) is received in the second light receiving region Rb is provided from the received light signal P1, and the positions of the optical windows 12a, 12b and light source 2 in the optical path of the transmitted light L3 are determined in advance. Thus, by applying simple triangulation to the optical path of the transmitted light L3, proximity sensing to measure a distance to the object 4 where reflection occurs is able to be performed.

For example, in the example of FIG. 2, as the object 4 approaches the optical sensor 1, the light receiving position where the transmitted light L3b through the second optical window 12b is received in the second light receiving region Rb shifts to the positive X side. Proximity sensing is able to be performed by using a received light signal P1 from the second light receiving region Rb.

When the object 4 contacts with the dome 10 of the optical sensor 1, no transmitted light L3 may arise, and this state is able to be identified by using a received light signal P1 from the second light receiving region Rb. In the first light receiving region Ra, a result of received reflected light L2 varies in accordance with a state where the dome 10 deforms under the contact force of the object 4, and tactile sensing is able to be performed by using a received light signal P1 from the first light receiving region Ra. For example, by analyzing the received light signal P1, various contact forces are able to be detected. A known technique is applicable as an analyzing method (see, for example, Japanese Patent No. 5825604 and International Publication No. 2014/045685).

As described above, with the optical sensor 1 of the first preferred embodiment, both tactile sensing and proximity sensing in the single optical sensor 1 are able to be provided with a simple optical mechanism that the dome 10 is provided with the mirror 11 and the optical windows 12. For example, a series of movements that the object 4 is in proximity and then further approaches to contact are able to be seamlessly detected by the same sensor.

The optical sensor 1 of the first preferred embodiment, which provides the above-described operation, is not limited to the example of FIG. 2. A modification of the optical sensor 1 of the first preferred embodiment will be described with reference to FIG. 3.

Figure 3:
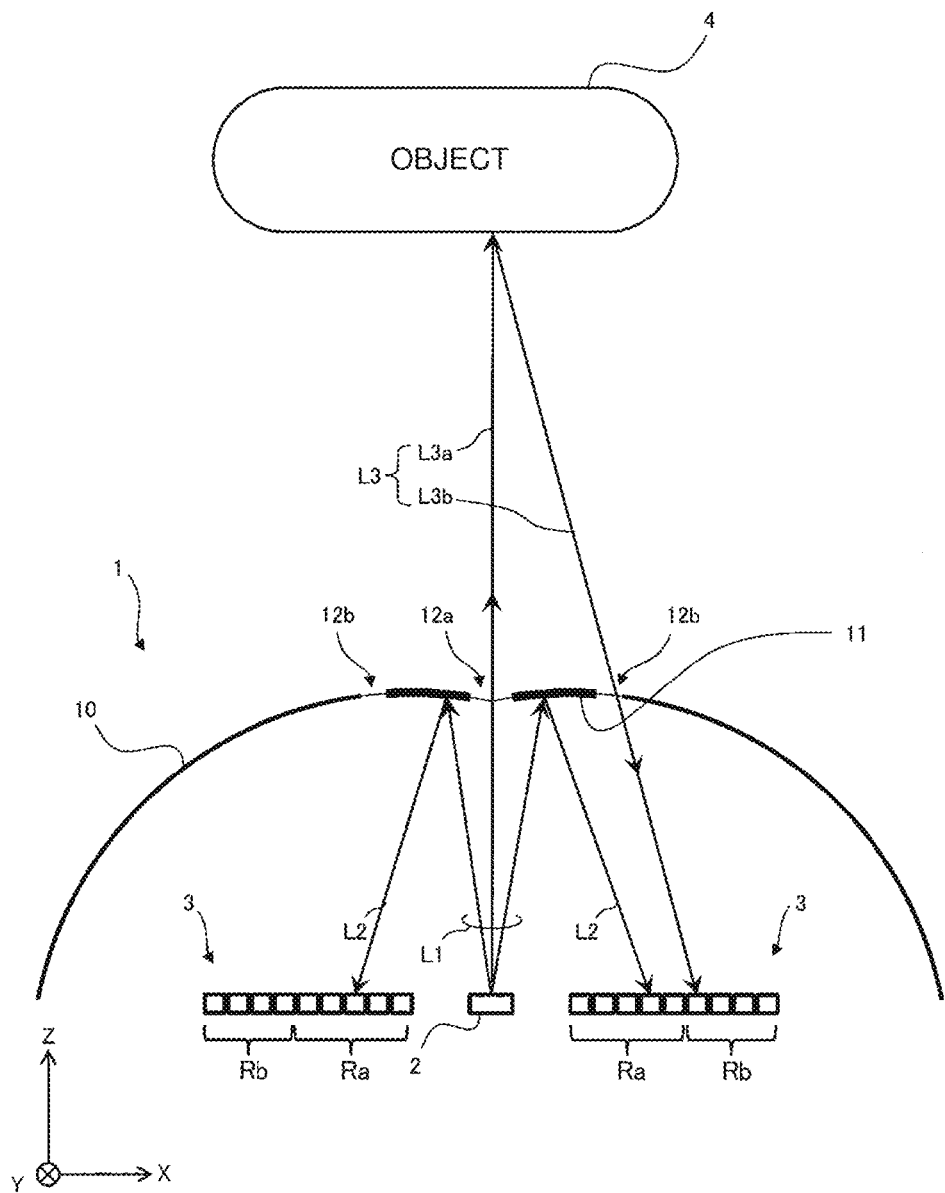
FIG. 3 is a diagram showing a modification of the optical sensor according to the first preferred embodiment of the present invention.

The shape of the dome 10 of the optical sensor 1 is not limited to a spheroid or substantially spheroidal and may include various curved surfaces, for example, a spherical or substantially spherical surface. In the modification of FIG. 3, the dome 10 has a shape of a combination of a plurality of curved surfaces. Alternatively, the shape of the dome 10 may be set by cutting a portion, where light from the light source 2 is estimated to strike, from a spheroid or the like.

In the example of FIG. 3, the light source 2 is located at the center or approximate center of the dome 10. In the optical sensor 1, the position of the light source 2 is not limited to a focal point and may be set to various positions. For example, the position of the light source 2 may be adjacent to or in a vicinity of the center of the dome 10. A plurality of light emitting elements that define the light source 2 may be located at a plurality of positions.

In the example of FIG. 3, the light receiving section 3 is located on each side of the light source 2 (in an X direction). The positions of the light receiving section 3 are not limited to focal points and may be set at various positions. The light receiving section 3 may include a plurality of light receiving elements provided around the light source 2. Instead of the plurality of light receiving elements, a plurality of light emitting elements defining and functioning as the light source 2 may be caused to emit light from a plurality of positions in a time-division manner, and sensing with the optical sensor 1 may be performed.

3. Summary

As described above, the optical sensor 1 according to the first preferred embodiment is an example of a tactile and proximity sensor that senses contact force and proximity of a physical object, for example, the object 4, in accordance with a result of received light. The optical sensor 1 includes the light source 2, the light receiving section 3, and the dome 10 that is an example of the cover. The light source 2 emits light. The light receiving section 3 receives light and generates a received light signal P1 providing a result of the received light. The dome 10 includes an elastic body that deforms under external force and covers the light source 2 and the light receiving section 3. The dome 10 includes the mirror 11 and the optical windows 12. The mirror 11 defines the reflective section that reflects light between the light source 2 and the light receiving section 3. The optical windows 12 define the transmission section that allows light to pass through in the first direction from the light source 2 and that allows light to pass through in the second direction from the light receiving section 3.

With the above-described optical sensor 1, both contact force and proximity of a physical object, for example, the object 4, are able to be detected with a simple mechanism that the dome 10 provided with the mirror 11 includes the optical windows 12. The first direction is, for example, the Z direction that is the direction of travel of transmitted light L3a through the first optical window 12a in the example of FIG. 2. The second direction is the direction of travel of transmitted light L3b through the second optical window 12b. The first and second directions may be set within the range of tolerance in accordance with the size and the like of each of the optical windows 12a, 12b. When the first direction is the Z direction, the accuracy of proximity sensing is able to be increased by reducing a positional deviation of transmitted light L3 with respect to the object 4 that is in proximity in the Z direction.

The transmission section in the first preferred embodiment includes the first optical window 12a corresponding to the first transmission region through which light from the light source 2 passes to exit to an outside in the first direction and the second optical window 12b corresponding to the second transmission region through which light that enters the light receiving section 3 passes from the outside in the second direction. An angle between the first direction and the second direction is regulated within a predetermined angular range by the position, size, and the like of the optical windows 12a, 12b. Within the angular range, proximity sensing of a physical object in accordance with triangulation is able to be simply performed.

In the first preferred embodiment, the light receiving section 3 includes the first light receiving region Ra that receives light that enters from the mirror 11 and the second light receiving region Rb that receives light that enters from the optical windows 12. Tactile sensing and proximity sensing are able to be performed by respectively using received light signals P1 provided from the light receiving regions Ra, Rb.

The optical sensor 1 of the first preferred embodiment may further include the control circuit 50 that analyzes a signal from the light receiving section. The control circuit 50 detects the contact force of the object 4 by detecting a distance between the mirror 11 and the light receiving section 3 by using a received light signal P1 from the light receiving section 3 (first light receiving region Ra) having received reflected light from the mirror 11. The control circuit 50 detects the proximity of the object 4 by detecting a distance between the object 4 and the light receiving section 3 by using a received light signal P1 from the light receiving section 3 (second light receiving region Rb) having received transmitted light from the optical windows 12. Thus, the contact force and proximity of the object 4 are able to be detected in the optical sensor 1.

Second Preferred Embodiment

In a second preferred embodiment of the present invention, a sensor array including a plurality of optical sensors provided in an array and that provides both tactile sensing and proximity sensing will be described with reference to FIGS. 4A and 4B to FIG. 9.

Figure 4A:
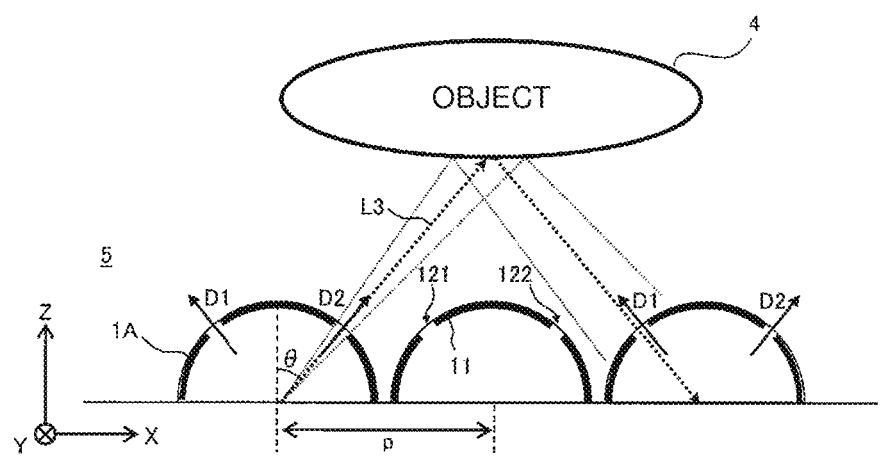
FIGS. 4A and 4B are diagrams showing the outline of a sensor array according to a second preferred embodiment of the present invention.
Figure 4B:
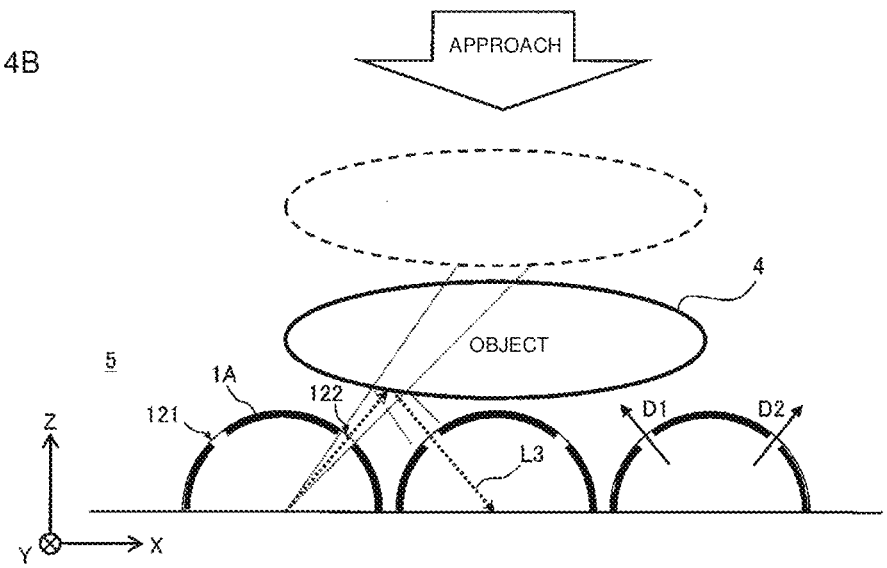

The outline of the sensor array according to the second preferred embodiment will be described with reference to FIGS. 4A and 4B. FIG. 4A shows an example of a state of proximity sensing in the sensor array 5 according to the second preferred embodiment. FIG. 4B shows a state where the object 4 is closer than the state of FIG. 4A.

The sensor array 5 according to the second preferred embodiment includes, for example, a plurality of optical sensors 1A including similar components to those of the first preferred embodiment. Hereinafter, an example in which the optical sensors 1A in the sensor array 5 are provided in the X direction will be described. The plurality of optical sensors 1A in the sensor array 5 may be integrally provided.

FIGS. 4A and 4B show the optical path of transmitted light L3 that exits from one optical sensor 1A in the sensor array 5. In the sensor array 5 according to the second preferred embodiment, transmitted light L3 from each optical sensor 1A is reflected by the object 4 and then received by another one of the optical sensors 1A in accordance with a distance to the object 4.

For example, in the state of FIG. 4B, since the object 4 is closer than the state of FIG. 4A, the optical sensor 1A that receives transmitted light L3 is closer to the optical sensor 1A that has emitted the light. With the sensor array 5 of the second preferred embodiment, proximity sensing that provides measurement of a distance to the object 4 through triangulation for each interval between the light emitting optical sensor 1A and the light receiving optical sensor 1A is able to be easily and simply implemented. Tactile sensing is also able to be performed as in the case of the first preferred embodiment in each of the optical sensors 1A.

The optical sensor 1A of the second preferred embodiment includes, for example, two optical windows 121, 122 provided in the X direction. In each optical sensor 1A, the negative X-side optical window 121 allows light to pass through in a D1 direction, and the positive X-side optical window 122 allows light to pass through in a D2 direction. The D1 and D2 directions each are set within the range of tolerance according to the size of an associated one of the optical windows 121, 122, a predetermined measurement distance range to the object 4, and the like.

For a distance to the object 4, specifically, where the pitch between any adjacent optical sensors 1A of the sensor array 5 is p and the D1 and D2 directions each are at an inclination angle of $\theta$ with respect to the Z direction, when the distance to the object 4 becomes $(2n-1)/2 * p * \cot(\theta)$, light is irradiated to the light receiving optical sensor 1A that is the nth from the optical sensor 1A emitting the light. Thus, the angle $\theta$ of each of the D1 and D2 directions and the size and pitch of the optical sensors 1A are able to be determined in accordance with the predetermined range and resolution of a distance to the object 4 in measurement.

In each of the optical sensors 1A of the second preferred embodiment, light guide (light emission and light reception)

of transmitted light L3 is performed, for example, both in the D1 and D2 directions. The number of optical windows of each optical sensor 1A is not limited to two and may be one or three or more for each sensor as long as, according to the locations of the optical windows, the relationship in which light exits from a light emitting element, reflects on the surface of the object 4, and enters a light receiving element of another sensor.

Figure 5:
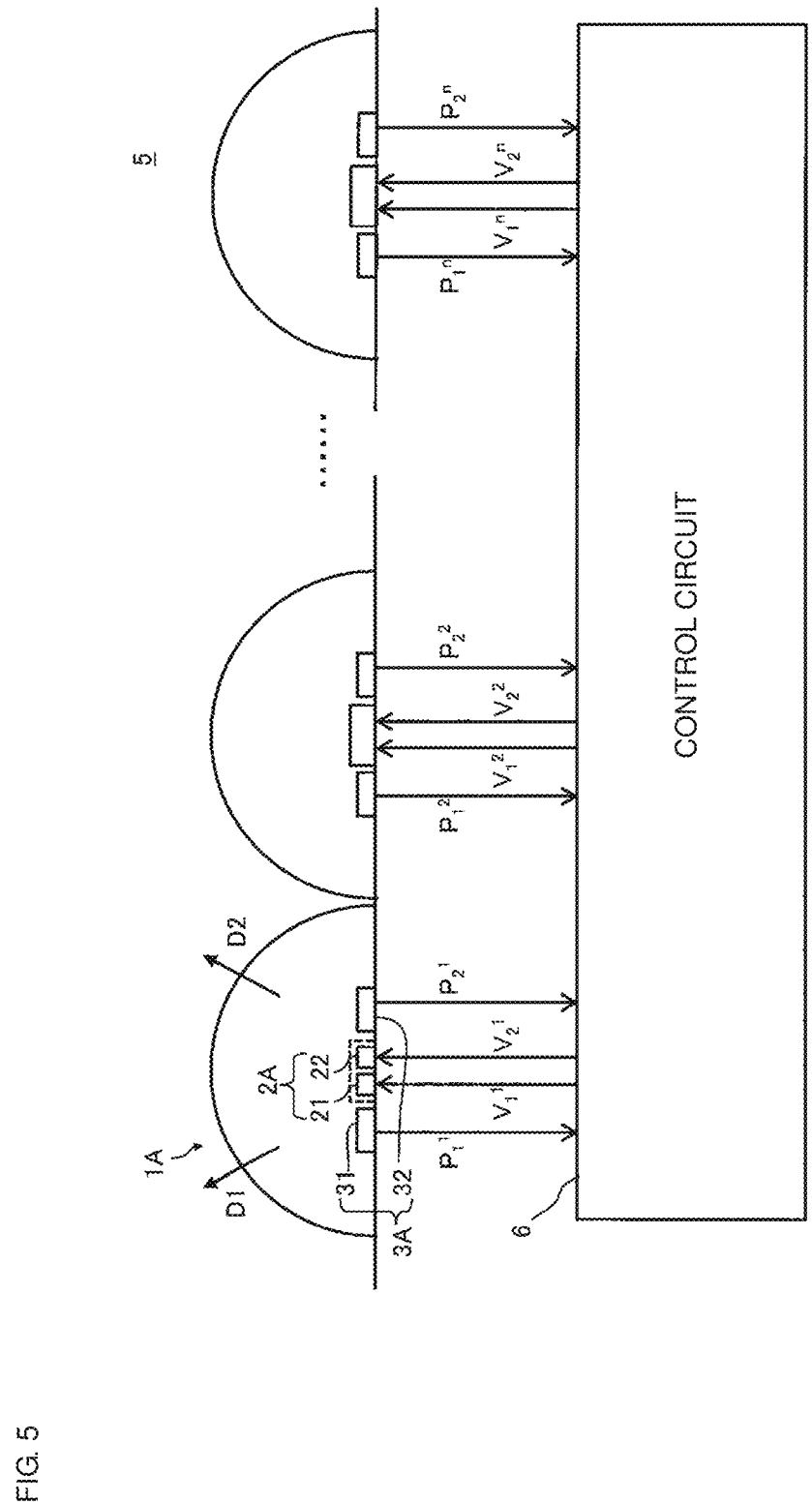
FIG. 5 is a block diagram showing the sensor array according to the second preferred embodiment of the present invention.

FIG. 5 is a block diagram showing the sensor array 5 according to the second preferred embodiment. The sensor array 5 of the second preferred embodiment further includes, for example, a control circuit 6 that controls the operation of the optical sensors 1A. In the second preferred embodiment, the control circuit 6 provides tactile sensing and proximity sensing with the optical sensors 1A in a time-division manner by scanning the optical sensors 1A in the sensor array 5 for light emission and light reception. Hereinafter, the number of the optical sensors 1A in the sensor array 5 is denoted by n (n is an integer greater than or about equal to two).

In each of the optical sensors 1A of the second preferred embodiment, for example, as shown in FIG. 5, the light source 2A includes a light emitting element 21 to emit light in the D1 direction and a light emitting element 22 to emit light in the D2 direction. A light receiving section 3A of each optical sensor 1A includes a light receiving element 31 to receive light in the D1 direction and a light receiving element 32 to receive light in the D2 direction. Light from each of the light emitting elements 21, 22 is irradiated to one of the optical windows 121, 122 and the mirror 11 around the one of the optical windows 121, 122.

Figure 6A:
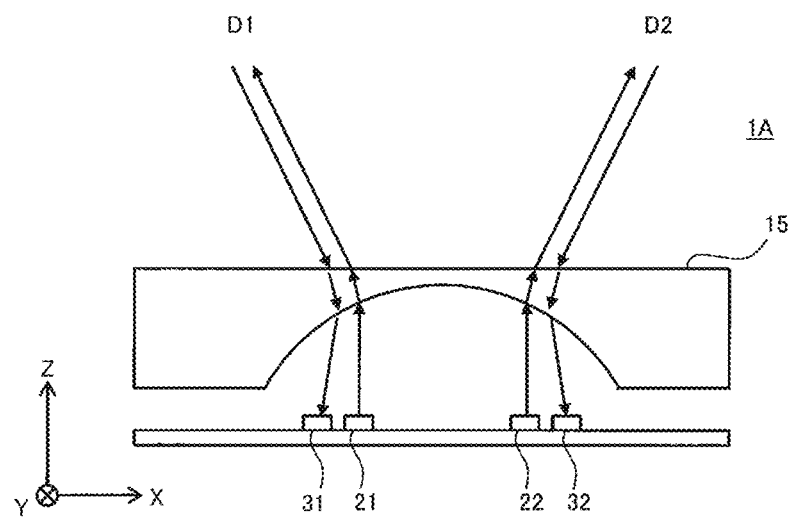
FIGS. 6A and 6B are diagrams showing examples of the internal structure of an optical sensor in the second preferred embodiment of the present invention.
Figure 6B:
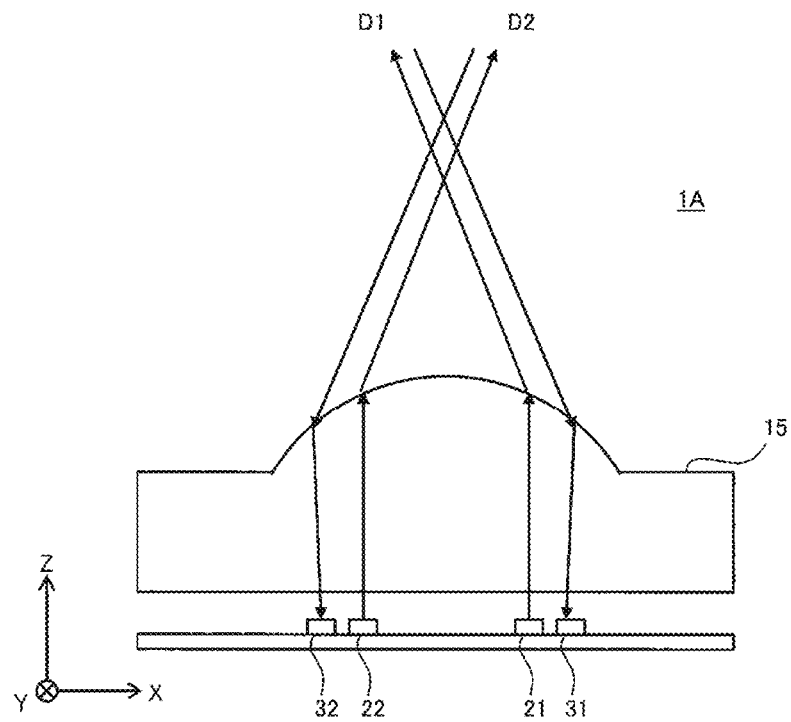

In the optical sensor 1A of the second preferred embodiment, each of the light receiving elements 31, 32 receives light from one of the optical windows 121, 122 (an example of the transmission section) and the mirror 11 (an example of the reflective section) around the one of optical windows 121, 122 (see FIGS. 4A and 4B). FIGS. 6A and 6B shows structures of the elements 21, 22, 31, 32 that provide the above-described light guide. The reflective section of the optical sensor 1A is not necessarily a mirror-finished surface, and the reflective section may include, for example, a reflective body that diffusely reflects light having a wave length of light that is emitted by the light source 2A, instead of the mirror 11.

FIGS. 6A and 6B show examples of the internal structure of the optical sensor 1A in the second preferred embodiment. In this example, the optical sensor 1A includes a lens 15. FIG. 6A shows an example of the case where the lens 15 is a concave lens. FIG. 6B shows an example of the case where the lens 15 is a convex lens. In these examples, the light emitting elements 21, 22 and the light receiving elements 31, 32 are displaced to the positive X side and the negative X side from the center position of the lens 15. Thus, for example, light guide for transmitted light L3 (FIGS. 4A and 4B) in the D1 direction or the D2 direction, inclined from the Z direction, is able to be provided.

Figure 7:
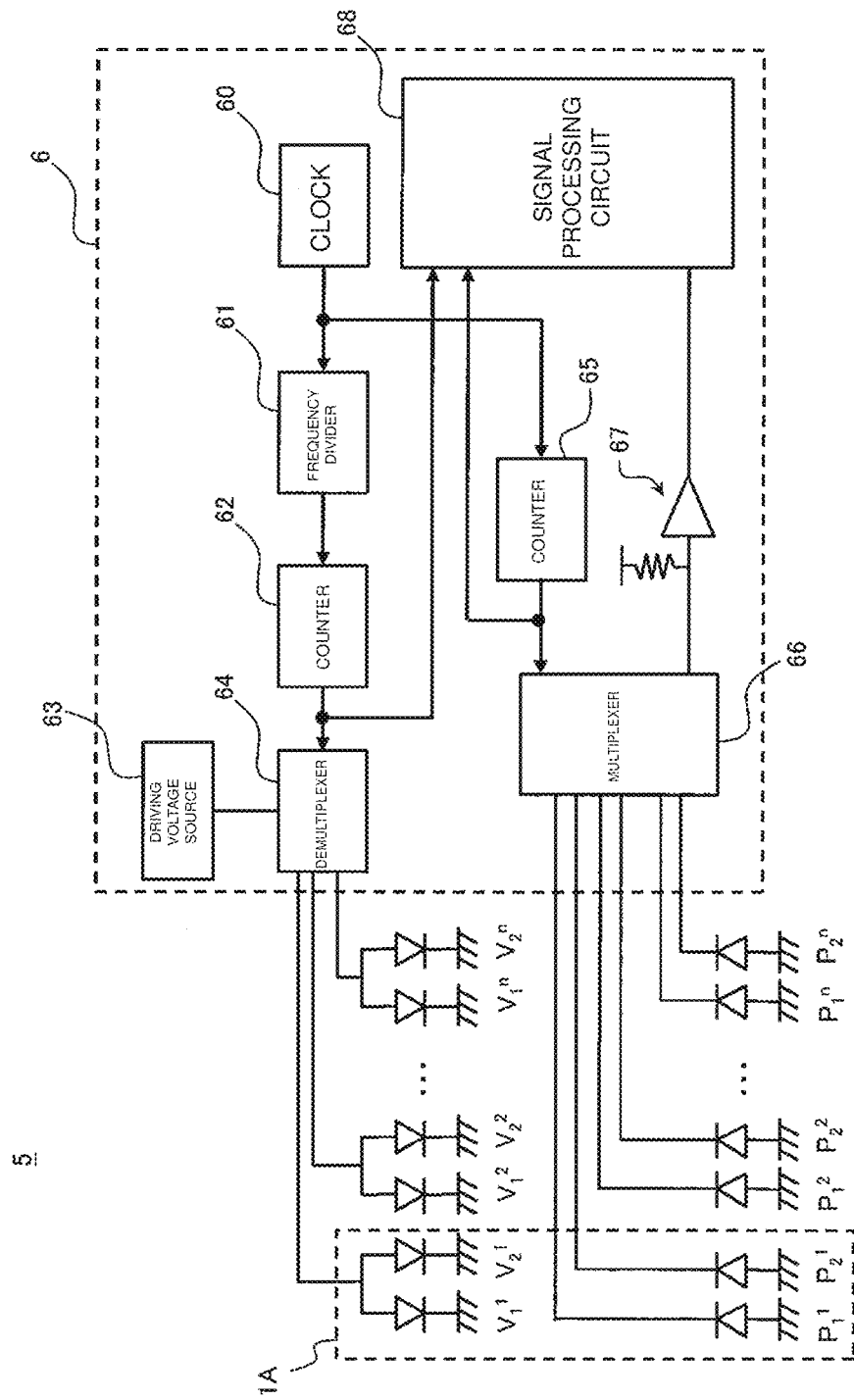
FIG. 7 is a circuit diagram showing the circuitry the sensor array according to the second preferred embodiment of the present invention.

FIG. 7 is a circuit diagram showing the circuitry of the sensor array 5 according to the second preferred embodiment. In the example of FIG. 7, the control circuit 6 includes a clock generation circuit 60, a frequency divider 61, a light emitting counter 62, a driving voltage source 63, a demultiplexer 64, a light receiving counter 65, a multiplexer 66, an amplifier 67, and a signal processing circuit 68.

The clock generation circuit 60 generates a clock signal having a predetermined clock period. The frequency divider 61 divides a clock signal to multiply the period of the clock signal by $2n$.

The light emitting counter 62 counts in the range of 1 to n in accordance with divided clock signals. The driving voltage source 63 generates a driving voltage to drive the light source 2. The demultiplexer 64 sequentially switches connection between the driving voltage source 63 and one of the light sources 2A of the n optical sensors 1A in accordance with a counted result of the light emitting counter 62 and supplies driving voltages $V_1^{\ 1}$ to $V_2^{\ n}$ of the light emitting elements 21, 22 (see FIG. 5).

The light receiving counter 65 counts in the range of 1 to 2n in accordance with a clock signal from the clock generation circuit 60. The multiplexer 66 sequentially selects received light signals $P_1^{\ 1}$ to $P_2^{\ n}$ from the light receiving elements 31, 32 of the n optical sensors 1A in accordance with a counted result of the light receiving counter 65 (see FIG. 5). The amplifier 67 amplifies an analog voltage of the selected received light signal and outputs the analog signal to the signal processing circuit 68.

The signal processing circuit 68 executes signal processing for tactile sensing and proximity sensing with the n optical sensors 1A by using an input voltage and counted results of the light emitting and light receiving counters 65.

Figure 8:
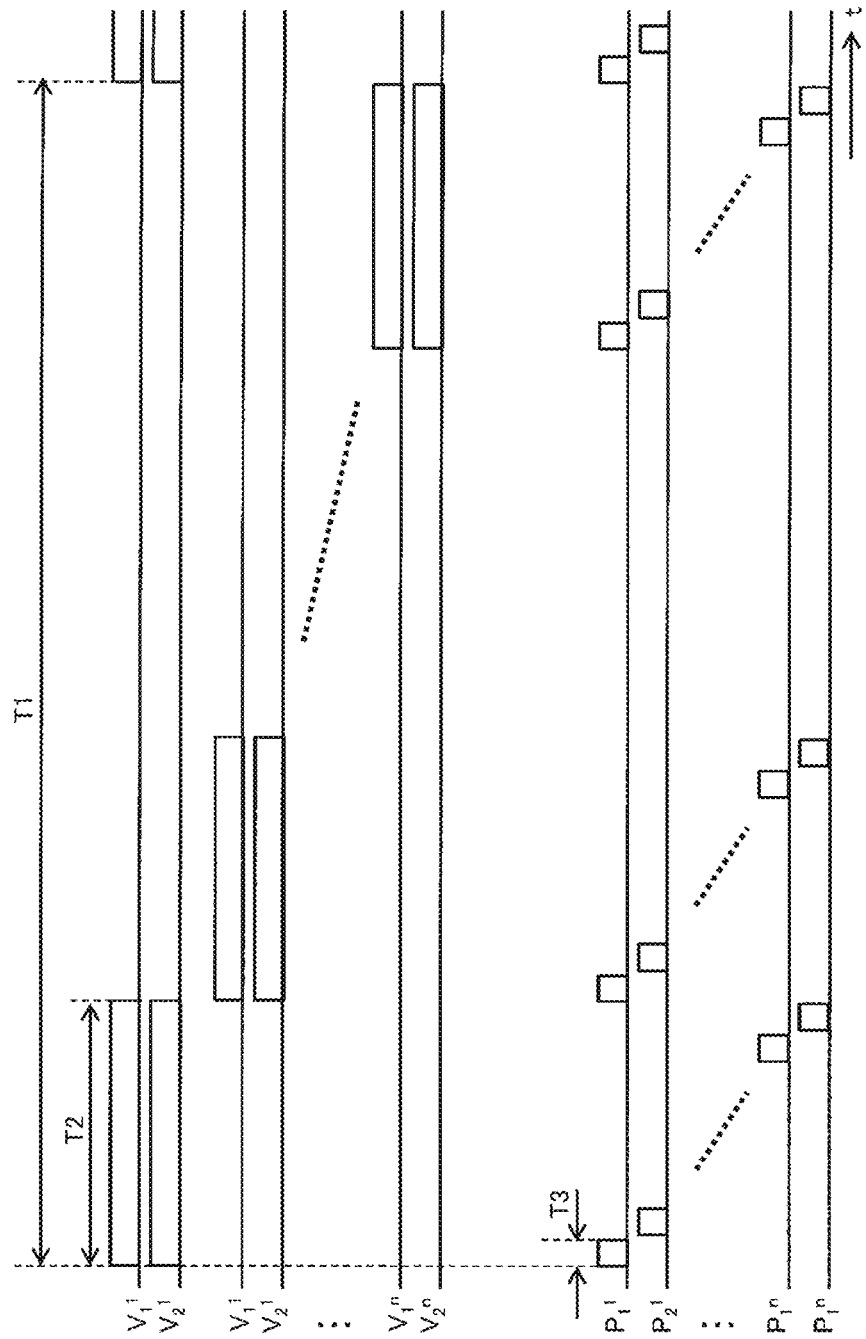
FIG. 8 is a timing chart showing an operation example of the sensor array according to the second preferred embodiment of the present invention.

FIG. 8 is a timing chart showing an operation example of the sensor array 5 according to the second preferred embodiment. The timing chart of FIG. 8 shows the supply timing of the driving voltages $V_1^{\ 1}$ to $V_2^{\ n}$ of the light emitting elements 21, 22 and the select timing of the received light signals $P_1^{\ 1}$ to $P_2^{\ n}$ from the light receiving elements 31, 32 by the control circuit 6 of FIG. 7.

In the operation example of FIG. 8, the control circuit of the sensor array 5 scans the n optical sensors 1A at a predetermined scanning period T1. The scanning period T1 is $2n \times n$ times as long as the clock period of the clock generation circuit 60 and is a short scanning period to capture the movement of the object 4, that is, for example, about 10 milliseconds.

In this operation example, the control circuit 6 supplies the driving voltages $V_1^{\ 1}$ to $V_2^{\ n}$ to the pair of light emitting elements 21, 22 of each optical sensor 1A at every light emission period T2 as shown in FIG. 8 by the light emitting counter 62 and the like (FIG. 7). Thus, the n light sources 2A of the sensor array 5 sequentially emit light in a time-division manner. The light emission period T2 is n times as long as the clock period in this example.

The control circuit 6 acquires the analog voltages of the received light signals $P_1^{\ 1}$ to $P_2^{\ n}$ by sequentially selecting the $2n$ light receiving elements 31, 32 in the sensor array 5 at every light receiving period T3 as shown in FIG. 8 by the light receiving counter 65 and the like (FIG. 7). Thus, in the light emission period T2 of one light source 2A, a positive X-side result of received light and a negative X-side result of received light in each optical sensor 1A are acquired as analog voltages. The light receiving period T3 is determined in consideration of the operation speed of each of the light receiving elements 31, 32 or an integration speed and is, for example, several microseconds. In this example, the light receiving period T3 is the same or substantially the same as the clock period. The clock period is set to a period that is long enough for the light receiving elements 31, 32 to function and short enough to capture the movement of the object 4.

The signal processing circuit 68 of the sensor array 5 is able to identify which one of a result of received light received by the light receiving element 31 and a result of received light received by the light receiving element 32 is an analog voltage acquired as described above during light emission of any one of the optical sensors 1A in the sensor array 5 by referencing counted results of the light emitting and light receiving counters 62, 65.

For example, the signal processing circuit 68 performs signal processing for tactile sensing on a result of received light, acquired at timing at which the light emitting optical sensor 1A and the light receiving optical sensor 1A coincide with each other. The signal processing circuit 68 also executes signal processing for proximity sensing on a result of received light, acquired at timing at which the light emitting optical sensor 1A and the light receiving optical sensor 1A are different from each other.

As described above, with the sensor array 5 of the second preferred embodiment, both tactile sensing and proximity sensing in scanning the plurality of optical sensors 1A are able to be provided.

In the above-described operation example (FIG. 8), in the light emission period T2 of one light source 2A, $2n$ light receiving elements 31, 32 in the sensor array 5 receive light in a time-division manner at every light receiving period T3 (=T2/2n). In the sensor array 5 of the second preferred embodiment, in light reception of one light receiving element, the light sources 2A may emit light in a time-division manner. This modification will be described with reference to FIG. 9.

Figure 9:
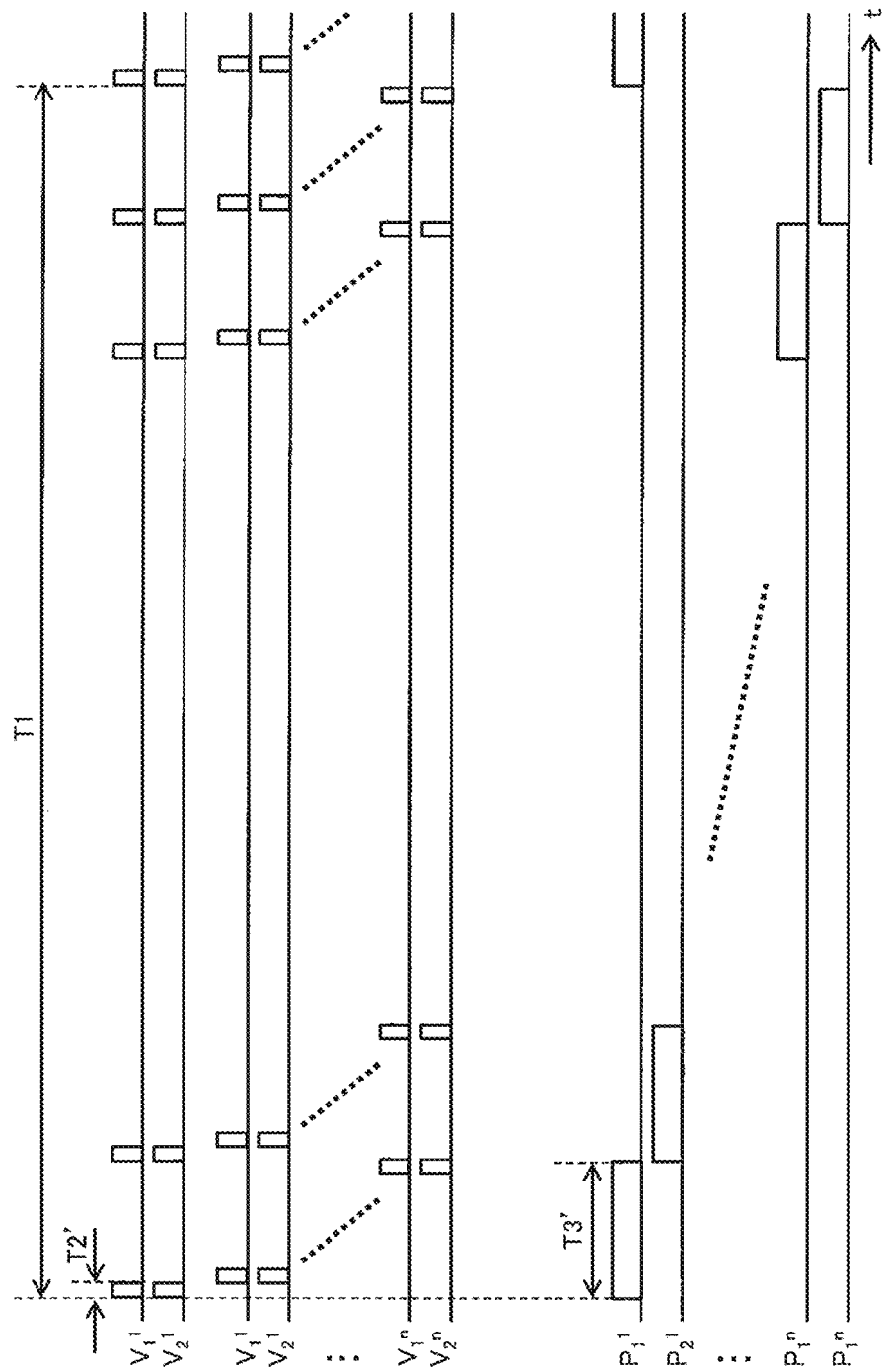
FIG. 9 is a timing chart showing a modification of the operation of the sensor array according to the second preferred embodiment of the present invention.

FIG. 9 is a timing chart showing a modification of the operation of the sensor array 5. The timing chart of FIG. 9, as well as FIG. 8, shows the supply timing of the driving voltages $V_1^1$ to $V_2^n$ of the light emitting elements 21, 22 and the select timing of the received light signals $P_1^1$ to $P_2^n$ from the light receiving elements 31, 32.

In this modification, the light emission period T2' of the light emitting elements 21, 22 is set to 1/n times as long as the light receiving period T3' of the light receiving elements 31, 32. Such settings may be provided by changing the frequency divider 61 and the like of FIG. 7. During operation of FIG. 9, the signal processing circuit 68 is able to identify which light emitting element has emitted light by using timing at which the analog voltage of an input received light signal varies in the light receiving period T3' of each of the light receiving elements 31, 32. Thus, with the operation of FIG. 9 as well, both tactile sensing and proximity sensing in scanning of the plurality of optical sensors 1A are able to be provided.

As described above, the sensor array 5 according to the second preferred embodiment includes the plurality of optical sensors 1A. The plurality of optical sensors 1A is provided in a one-dimensional array. Both tactile sensing and proximity sensing by emitting and receiving transmitted light L3 with the plurality of optical sensors 1A are able to be provided.

In the second preferred embodiment, the sensor array 5 further includes, for example, the control circuit 6. The control circuit 6 sequentially causes the light sources 2A of the optical sensors 1A to emit light. The control circuit 6 detects the contact force of the object 4 by using a received light signal from the light receiving section 3A of the light emitting optical sensor 1A. The control circuit 6 detects the proximity of the object 4 by using a received light signal from the light receiving section 3A of the optical sensor 1A different from the light emitting optical sensor 1A. The sensor array 5 may be provided by a module or the like separate from the control circuit 6.

The control circuit 6 detects the contact force of a physical object by detecting a distance between the reflective section and the light receiving section by using a signal from the light receiving section having received reflected light from the reflective section in the sensor array 5. The control circuit 6 detects the proximity of a physical object by detecting a distance between the physical object and the light receiving section by using a signal from the light receiving section having received transmitted light from the transmission section in the sensor array 5. Thus, the contact force and proximity of a physical object are able to be detected in the sensor array 5.

Third Embodiment

In the second preferred embodiment, the sensor array in a one-dimensional array is described. In a third preferred embodiment of the present invention, a sensor array in a two-dimensional array will be described with reference to FIG. 10 to FIG. 12.

Figure 10:
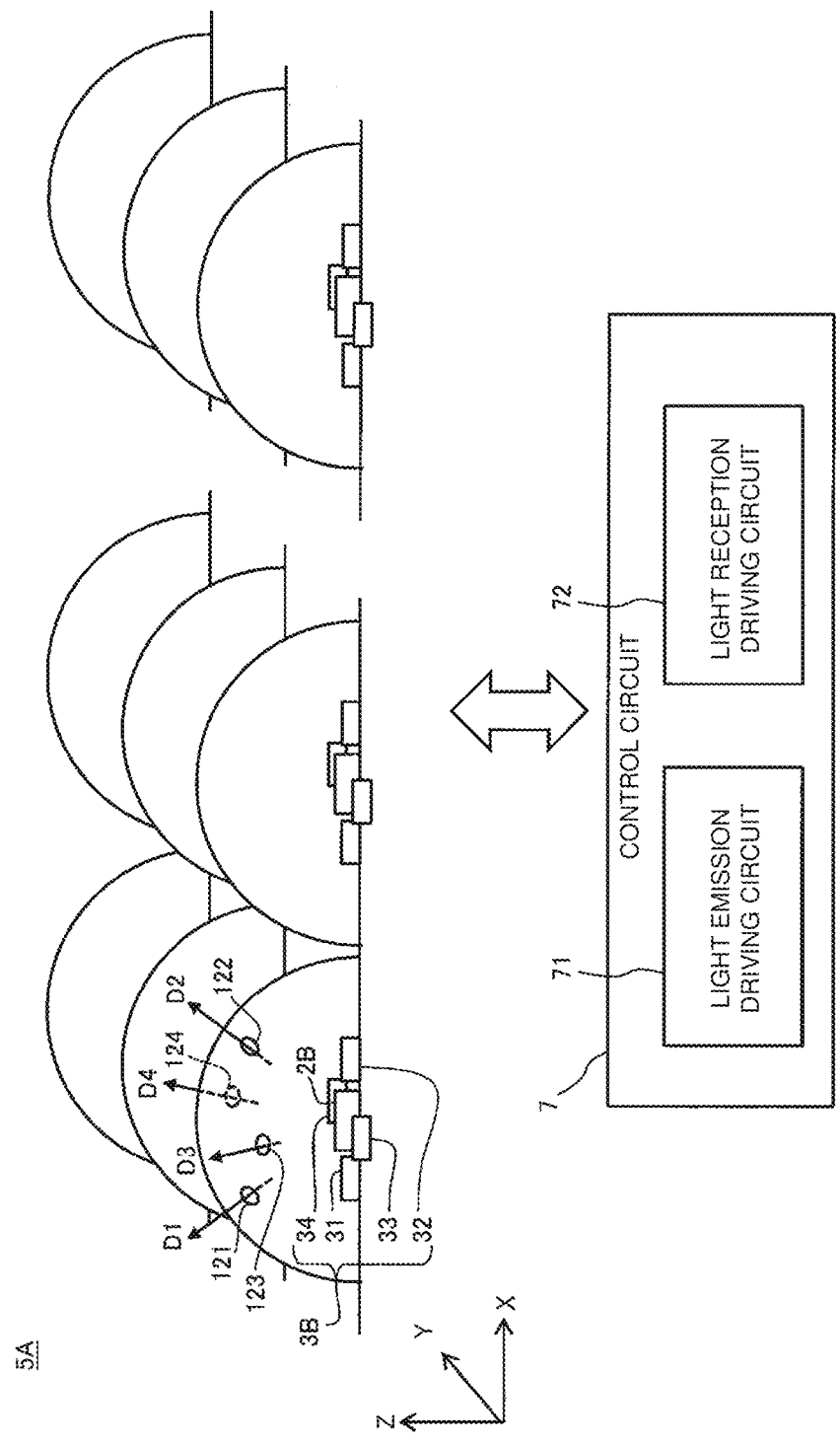
FIG. 10 is a block diagram showing a sensor array according to a third preferred embodiment of the present invention.

FIG. 10 is a block diagram showing a sensor array 5A according to the third preferred embodiment. The sensor array 5A according to the third preferred embodiment includes a plurality of optical sensors 1B provided in a two-dimensional array. Hereinafter, an example in which the optical sensors 1B in the sensor array 5A are provided in a matrix in an XY plane will be described.

The optical sensor 1A of the second preferred embodiment emits and receives transmitted light in the positive and negative X-side D1 and D2 directions. The optical sensor 1B of the third preferred embodiment, for example, emits and receives transmitted light in positive and negative Y-side D3 and D4 directions in addition to the structure and features similar to the optical sensor 1A of the second preferred embodiment. For example, the optical sensor 1B of the third preferred embodiment includes four light receiving elements 31 to 34 associated with the D1 to D4 directions in the light receiving section 3A. A light source 2B of the optical sensor 1B includes, for example, four light emitting elements that emit light in four D1 to D4 directions. In addition, the optical sensor 1B includes four optical windows 121 to 124 associated with the D1 to D4 directions, and the like.

The sensor array 5A of the third preferred embodiment is able to provide tactile sensing and proximity sensing with the optical sensors 1B as in the case of the second preferred embodiment by two-dimensionally scanning the optical sensors 1B in the sensor array 5A. For example, a control circuit 7 of the sensor array 5A of the third preferred embodiment includes a light emission driving circuit 71 that drives the light sources 2B of the optical sensors 1B in the sensor array 5A, and a light reception driving circuit 72 that drives the light receiving sections 3B.

Figure 11:
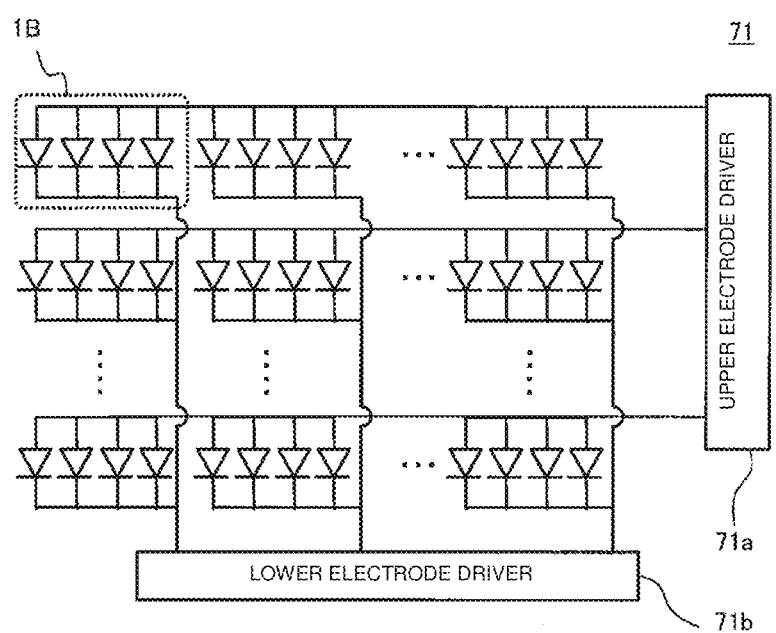
FIG. 11 is a circuit diagram showing an example of a light emission driving circuit in the sensor array of the third preferred embodiment of the present invention.

FIG. 11 is a circuit diagram showing an example of the light emission driving circuit 71 in the sensor array 5A of the third preferred embodiment. The light emission driving circuit 71 includes an upper electrode driver 71a that scans one of electrodes of the light emitting element in each of the optical sensors 1B in the sensor array 5A, and a lower electrode driver 71b that scans the other one of the electrodes. The light emission driving circuit 71 of the sensor array 5A of the third preferred embodiment may be provided by applying a known LED matrix or passive LCD matrix driving technique, for example.

Figure 12:
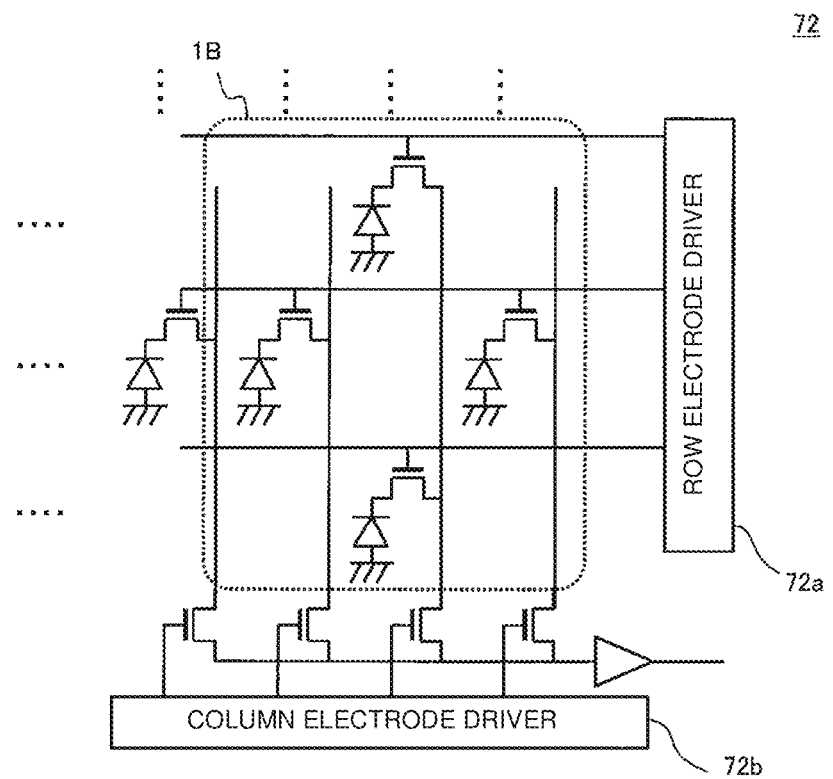
FIG. 12 is a circuit diagram showing an example of a light reception driving circuit in the sensor array of the third preferred embodiment of the present invention.

FIG. 12 is a circuit diagram showing an example of the light reception driving circuit 72 in the sensor array 5A of the third preferred embodiment. The light reception driving circuit includes a row electrode driver 72a and a column electrode driver 72b, and each of the four light receiving elements 31 to 34 of each of the optical sensors 1B in the sensor array 5A is scanned. The light reception driving circuit 72 of the sensor array 5A of the third preferred embodiment may be provided by applying a known CMOS image sensor driving technique.

As described above, in the sensor array 5A according to the third preferred embodiment, the plurality of optical sensors 1B are provided in a two-dimensional array. With the sensor array 5A of the third preferred embodiment, a two-dimensional distribution of contact force or proximity distance of the object 4 is provided by the optical sensors 1B in a two-dimensional array, and the shape or the like of the object 4 is also able to be detected.

In the above description, an example in which the plurality of optical sensors 1B are provided in the XY plane is described. The sensor array 5A of the third preferred embodiment is not limited to being provided in a plane, and the plurality of optical sensors 1B may be provided in various curved planes. The sensor array 5A of the third preferred embodiment is not limited to a matrix array and may be provided in various two-dimensional arrays.

In the above-described first to third preferred embodiments, the dome 10 is shown as the cover in the optical sensors 1 to 1B. However, the cover is not limited to the dome 10. For example, the cover may be not entirely an elastic body and may partially include a portion of an elastic body, and a mechanism, for example, a transmission section may be provided on a hard sheet or rigid body. Accordingly, for example, the rigid body may include a mechanism that deforms under external stress by a support mechanism for the portion of the elastic body. The cover may be, for example, a frame with a leaf spring, or the like (see Japanese Patent No. 5825604). The elastic body may be a metal material in addition to the above-described material or may include a metal material that deforms under external force and that attempts to return to an original shape.

In the above-described second preferred embodiment, an example in which the two light emitting elements 21, 22 are provided the light source 2A is described. However, the number of light emitting elements in the light source 2A is not limited to two, and various numbers may be included. The number of light receiving elements in the light receiving section 3A is also not limited. This also applies to the optical sensor 1B of the third preferred embodiment. In the above-described second and third preferred embodiments, each of the sensor arrays 5, 5A includes the plurality of optical sensors 1A or the plurality of optical sensors 1B. A sensor array including a plurality of the optical sensors 1 of the first preferred embodiment may be provided.

In the above-described second preferred embodiment, an example in which the lens 15 (FIG. 5) is provided as a structure to guide transmitted light L3 in the specific D1 or D2 direction is described. Modifications of the structure will be described with reference to FIGS. 13A to 13D.

FIGS. 13A to 13D are views for showing the modifications of the internal structure of the optical sensor 1A. FIGS. 13A to 13D show examples in which chips 16 in each of which both the light emitting element 21 of the light source 2A and the light receiving element 31 of the light receiving section 3A are integrated are provided.

Figure 13A:
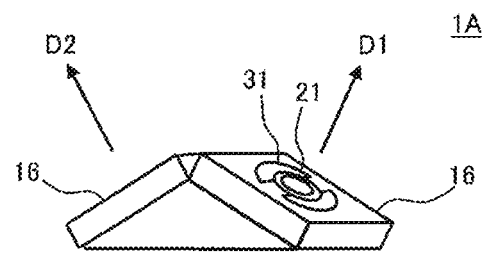
FIGS. 13A to 13D are diagrams showing modifications of the internal structure of the optical sensor.

FIG. 13A shows a modification of an inclined structure of the chips 16. Inside the optical sensor 1A, the chips 16 may be provided at an angle with the normal or substantially normal directions of the two chips 16 respectively directed in the D1 and D2 directions. For example, VCSEL that emits light in the normal or substantially normal direction may be provided as the light emitting element 21 on the chip 16.

Figure 13B:
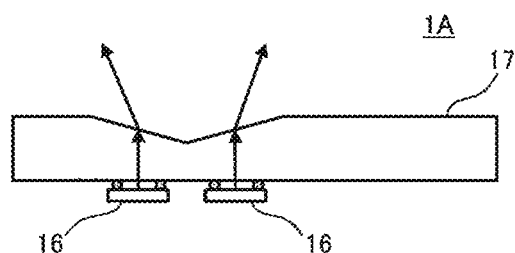

FIG. 13B shows a modification with a prism 17. In the optical sensor 1A, as shown in FIG. 13B, conversion of the optical path may be performed by the prism 17. In the example of FIG. 13B, two chips 16 are bonded by flip chip bonding to the prism 17.

Figure 13C:
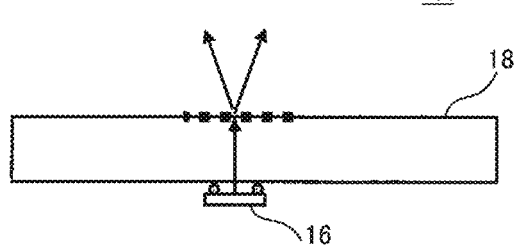

FIG. 13C shows a modification with a Fresnel lens 18. Not limited to the prism 17, the Fresnel lens 18 manufactured by, for example, nanoimprint or the like may be included with the optical sensor 1A. In the example of FIG. 13C, one chip 16 is bonded by flip chip bonding to the prism 17, and bifurcated optical paths are formed.

Figure 13D:
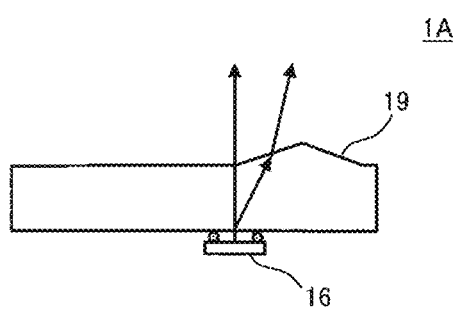

FIG. 13D shows a modification with a birefringent optical element 19. In the optical sensor 1A, bifurcation of an optical path is not limited to usage of the Fresnel lens 18 and may be performed by, for example, a birefringent optical element 19, for example, calcite. The birefringent optical element 19, for example, calcite, may be included to change the direction of an optical path. Accordingly, for example, a light emitting element that emits circularly or substantially circularly polarized light is included with the light source 2A.

Similar modifications to those of FIGS. 13A to 13D are also applicable to the preferred embodiments other than the second preferred embodiment. In FIGS. 13A to 13D, modifications with the chip 16 are described; however, the light source 2A and the light receiving section 3A do not need to be integrated in the same chip 16.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A tactile and proximity sensor that senses contact force and proximity of a physical object in accordance with a result of received light, the tactile and proximity sensor comprising:
    a light source that emits light;
    a light receiving section that receives light and that generates a signal providing a result of the received light; and
    a cover including an elastic body that deforms under external force and that covers the light source and the light receiving section; wherein
    the cover includes:
        a reflective section that reflects light between the light source and the light receiving section; and
        a transmission section that allows light to pass through in a first direction from the light source and that allows light to pass through in a second direction from the light receiving section.

2. The tactile and proximity sensor according to claim 1, wherein the transmission section includes a first transmission region through which light passes to exit from the light source to an outside in the first direction, and a second transmission region through which light passes to enter the light receiving section from the outside in the second direction.

3. The tactile and proximity sensor according to claim 1, wherein the light receiving section includes a first light receiving region that receives light that enters from the reflective section and a second light receiving region that receives light that enters from the transmission section.

4. The tactile and proximity sensor according to claim 1, further comprising:
    a control circuit that analyzes a signal from the light receiving section; wherein the control circuit detects contact force of the physical object by detecting a distance between the reflective section and the light receiving section according to a signal from the light receiving section having received light reflected from the reflective section; and the control circuit detects proximity of the physical object by detecting a distance between the physical object and the light receiving section according to a signal from the light receiving section having received light transmitted from the transmission section.

5. A sensor array comprising:
a plurality of the tactile and proximity sensors according to claim 1.

6. The sensor array according to claim 5, wherein the plurality of tactile and proximity sensors are provided in a one-dimensional array or in a two-dimensional array.

7. The sensor array according to claim 5, further comprising:
a control circuit that controls the plurality of tactile and proximity sensors; wherein
the control circuit sequentially controls the light sources of the tactile and proximity sensors to emit light;
the control circuit detects contact force of a physical object according to a signal from the light receiving section of the tactile and proximity sensor that is emitting light; and
the control circuit detects proximity of the physical object according to a signal from the light receiving section of another one of the tactile and proximity sensors different from the tactile and proximity sensor that is emitting light.

8. The sensor array according to claim 7, wherein
the control circuit detects contact force of the physical object by detecting a distance between the reflective section and the light receiving section according to a signal from the light receiving section having received light reflected from the reflective section; and
the control circuit detects proximity of the physical object by detecting a distance between the physical object and the light receiving section according to a signal from the light receiving section having received light transmitted from the transmission section.

9. The tactile and proximity sensor according to claim 1, wherein the light source is a laser or a sold light emitting element.

10. The tactile and proximity sensor according to claim 1, wherein the light source includes a plurality of light emitting elements.

11. The tactile and proximity sensor according to claim 1, wherein the light receiving section is a photodiode.

12. The tactile and proximity sensor according to claim 1, wherein the elastic body is a dome having a hollow spheroidal or substantially spheroidal shape.

13. The tactile and proximity sensor according to claim 12, wherein the reflective section is provided on an inner surface of the dome.

14. The tactile and proximity sensor according to claim 1, wherein
the cover further includes a non-reflective section; and
a reflectance of the reflective section is more than or about equal to twice a reflectance of the non-reflective section.

15. The tactile and proximity sensor according to claim 1, wherein a transparency of the transmission section is higher than or about equal to ten times a transparency of the reflective section.

16. The tactile and proximity sensor according to claim 1, wherein the transmission section is defined by holes provided in the cover.

17. The tactile and proximity sensor according to claim 16, wherein the holes are filled with a material different from a material of the cover.

18. The tactile and proximity sensor according to claim 4, wherein the control circuit includes a driving voltage source that generates a driving voltage for the light source.

* * * * *